(12) United States Patent
Clement (10) Patent No.: US 8,036,625 B1
(45) Date of Patent: Oct. 11, 2011

(54) METHOD AND APPARATUS FOR MIXING A SIGNAL

(75) Inventor: Patrick Clement, Belmont (CH)

(73) Assignee: Marvell International Ltd., Hamilton (BM)

( * ) Notice: Subject to any disclaimer, the term of this patent is extended or adjusted under 35 U.S.C. 154(b) by 1127 days.

(21) Appl. No.: 11/774,979

(22) Filed: Jul. 9, 2007

Related U.S. Application Data (60) Provisional application No. 60/830,130, filed on Jul. 11, 2006.

(51) Int. Cl.
*H04B 1/26* (2006.01)

(52) U.S. Cl. ............... 455/323; 455/326; 455/334

(58) Field of Classification Search .......... 455/230, 455/255–259, 313, 318, 323, 325, 326, 334, 455/339, 340, 341

See application file for complete search history.

(56) References Cited

U.S. PATENT DOCUMENTS

| | | | | |
|---|---|---|---|---|
| 5,191,334 A | * | 3/1993 | Yasuda | ............ 341/61 |
| 5,825,829 A | | 10/1998 | Borazjani et al. | |
| 6,356,594 B1 | | 3/2002 | Clement et al. | |
| 7,672,361 B2 | * | 3/2010 | Underbrink et al. | ...... 375/152 |
| 2006/0145900 A1 | | 7/2006 | Clement et al. | |
| 2010/0173601 A1 | * | 7/2010 | Beamish et al. | ........ 455/326 |

FOREIGN PATENT DOCUMENTS

| WO | WO-00/74230 A1 | 12/2000 |
|---|---|---|
| WO | WO-01/03285 A1 | 1/2001 |

* cited by examiner

*Primary Examiner* — Nhan Le (57) ABSTRACT

In a method for mixing an information signal, a digital information signal at a sampling frequency $f_s$ is generated. A mixed signal is generated as a multiplication of the digital information signal with a mixing signal at the sampling frequency $f_s$, wherein the mixing signal corresponds to a sinusoid having a frequency $f_m$ equal to $f_s/8$.

52 Claims, 7 Drawing Sheets

METHOD AND APPARATUS FOR MIXING A SIGNAL

CROSS-REFERENCES TO RELATED APPLICATIONS

The present application claims the benefit of U.S. Provisional Application No. 60/830,130, entitled "DIGITAL IF MIXING AT FCLK/8," filed on Jul. 11, 2006, which is hereby incorporated by reference herein in its entirety.

FIELD OF TECHNOLOGY

The present disclosure relates generally to communication devices, and more particularly, to techniques for shifting a signal in the frequency domain.

DESCRIPTION OF THE RELATED ART

In many transmitters, an information signal is first up-converted to an intermediate frequency (IF) to generate an IF signal. Then, the IF signal is up-converted to a carrier frequency and transmitted. Similarly, in a superheterodyne receiver, a received signal is down-converted to an IF frequency to generate an IF signal. Next, the IF signal is down-converted to baseband to re-generate the information signal. As is well known, the shifting of a signal to or from an If frequency may be accomplished by multiplying the signal by a sinusoid. In a receiver, the resultant signal is filtered with a low-pass filter to remove unwanted high frequency components.

In at least some receivers or transmitters, it may be practical to implement this multiplication operation in the digital domain. For example, in a receiver, an IF signal could be a digital signal and the multiplication operation could include multiplying the digital IF signal by a digital sinusoidal signal. As is well known to those of ordinary skill in the art, however, a digital multiplier may comprise a large number of logic gates, may consume a relatively large area on an integrated circuit, and thus may be relatively expensive to implement.

In one particular receiver system, a mixing signal frequency ($f_{IF}$) was chosen to be one quarter of the sampling frequency of the digital IF signal (i.e., sampling frequency=$4 \cdot f_{IF}$). Because of this relationship between the IF frequency and the sampling frequency, a sinusoid at the IF frequency (e.g., $\cos(2 \cdot \pi \cdot f_{IF} \, t)$) can be represented as the sequence [+1, 0, −1, 0, +1, 0, . . . ]. Thus, in this receiver system, multiplication with $\cos(2 \cdot \pi \cdot f_{IF} t)$ can be implemented without a multiplier. Rather, the multiplication operation can be implemented by merely setting every $2^{nd}$ sample to zero, starting with the second sample, and changing the polarity of every $4^{th}$ sample starting with the third sample, for example.

SUMMARY OF THE DISCLOSURE

In one embodiment, a method for mixing an information signal includes generating a digital information signal at a sampling frequency $f_s$. The method also includes generating a mixed signal as a multiplication of the digital information signal with a mixing signal at the sampling frequency $f_s$, wherein the mixing signal corresponds to a sinusoid having a frequency $f_m$, equal to $f_s/8$.

In another embodiment, a mixer for a communication device comprises an input to receive a digital information signal at a sampling frequency $f_s$. Additionally, the mixer comprises a multiplication circuit to generate a multiplication of the digital information signal by a mixing signal at the sampling frequency $f_s$, wherein the mixing signal corresponds to a sinusoid having a frequency $f_m$ equal to $f_s/8$.

In yet another embodiment, a method of down-converting a received signal includes converting an analog modulated information signal to a digital information signal at a sampling frequency $f_s$, and filtering the digital signal with a high-pass filter. The method also includes generating a mixed signal based on a multiplication of the digital information signal with a mixing signal at the sampling frequency $f_s$, wherein the mixing signal corresponds to a sinusoid having a frequency $f_m$ equal to $f_s/8$. The method further includes filtering the first mixed signal with a first low-pass filter.

In still another embodiment, a down-converter for a communication device comprises an analog-to-digital converter (ADC), and a high-pass filter coupled to an output of the ADC, wherein an output of the high-pass filter is at a sampling frequency $f_s$. Additionally, the down-converter comprises a mixer having an input coupled to an output of the high-pass filter, the mixer configured to generate an output based on a multiplication of a signal received via the input with a mixing signal at the sampling frequency $f_s$ wherein the mixing signal corresponds to a sinusoid having a frequency $f_m$ equal to $f_s/8$. The down-converter further comprises a low-pass filter having an input coupled to the output of the mixer.

DETAILED DESCRIPTION

Figure 1:
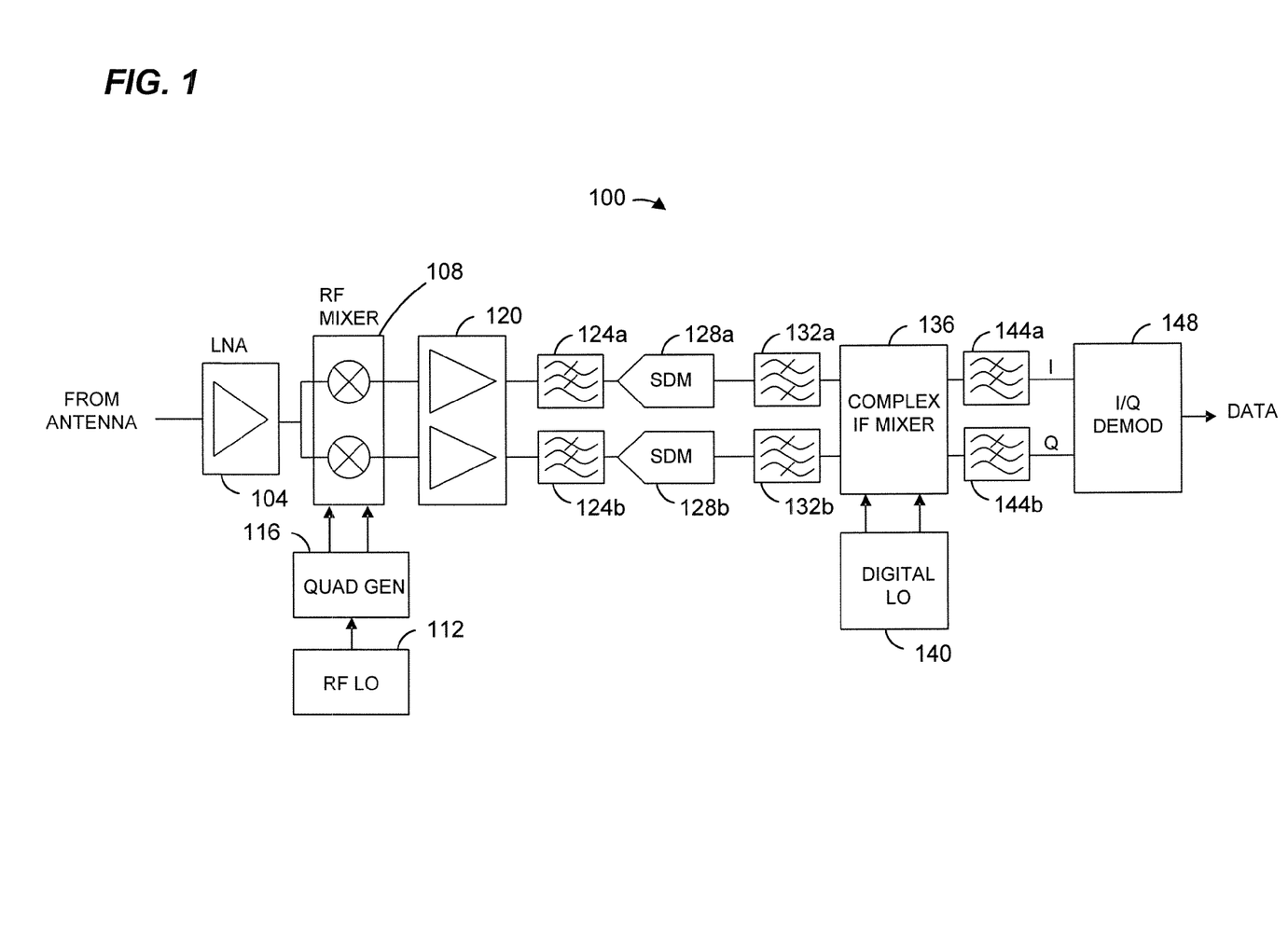
FIG. 1 a block diagram of an example frequency modulation receiver.

FIG. 1 is a block diagram of an example frequency modulation (FM) receiver 100 that may utilize a new intermediate frequency (IF) mixer to be described in more detail below. The receiver 100 comprises a low noise amplifier (LNA) 104 that is coupled to receive a signal from an antenna. An output of the LNA 104 is coupled to a radio frequency (RF) mixer 108. A RF local oscillator 112 provides a reference signal to a quadrature generator 116. The quadrature generator 116 generates two sinusoidal signals that differ in phase by 90 degrees and which are provided to the RF mixer 108. The RF mixer 108 generates two outputs corresponding to two components of a complex signal. A gain stage 120 is coupled to receive the outputs of the RF mixer 108 and to generate two outputs, which are provided to analog filters 124a and 124b. Outputs of the analog filters 124a and 124b are provided to sigma-delta modulation (SDM) analog-to-digital converters (ADCs) 128a and 128b. Digital outputs of the SDM ADCs 128a and 128b are provided to filters/decimators 132a and 132b. Outputs of the filters/decimators 132a and 132b are provided to a complex IF mixer 136 which generates two outputs. A digital local oscillator (LO) 140 provides in-phase and quadrature-phase reference signals to the complex IF mixer 136. The two outputs of the complex IF mixer 136 are provided to filters/decimators 144a and 144b. The outputs of the filters/decimators 144a and 144b correspond to an in-phase (I) signal and a quadrature-phase (Q) signal, and these outputs are provided to an I/Q demodulator 148, which demodulates the I and Q signals to generate a baseband data signal.

Figure 2:
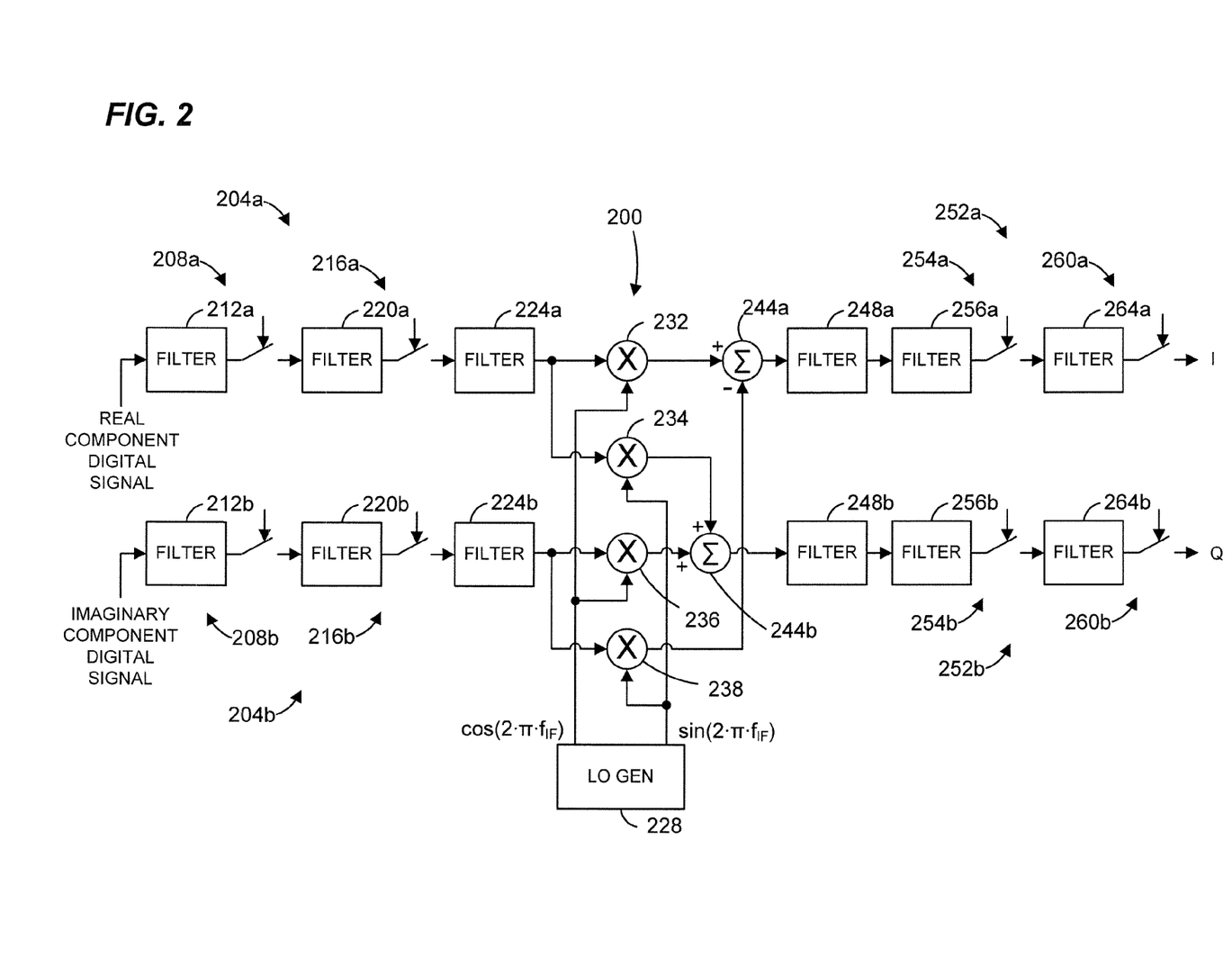
FIG. 2 is a block diagram of an example complex intermediate frequency (IF) mixer that may be utilized with a receiver such as the receiver of FIG. 1.

FIG. 2 is a block diagram of an example complex IF mixer 200 that may be utilized with a receiver such as the receiver 100 of FIG. 1. The block diagram of FIG. 2 also includes at least portions of filter/decimators that are upstream and downstream of the mixer 200. For example, referring to FIGS. 1 and 2, an output of the SDM ADC 128a (referred to in FIG. 2 as a "real component digital signal") may be coupled to an input of a multi-stage decimator 204a, and an output of the SDM ADC 128b (referred to in FIG. 2 as an "imaginary component digital signal") may be coupled to an input of a multi-stage decimator 204b. The multi-stage decimator 204a may include a decimator 208a having a filter 212a. The filter 212a may act as a decimation filter, and may also act to smooth the output of the SDM ADC 128a. Similarly, the multi-stage decimator 204b may include a decimator 208b having a filter 212b that acts as a decimation filter and smoothes the output of the SDM ADC 128b. For example, the filter 212b could be a $4^{th}$ order SINC filter, or any other suitable filter. The multi-stage decimator 204a may also include a decimator 216a having a decimation filter 220a. An output of the decimator 208a may be coupled to an input of the decimator 216a. Similarly, the multi-stage decimator 204b may also include a decimator 216b having a decimation filter 220b. An output of the decimator 208b may be coupled to an input of the decimator 216b.

The multi-stage decimator 204a acts to convert the sampling rate (or frequency) of the signal from the SDM ADC 128a to a sampling rate (or frequency) $f_s$ that is 8 times the IF frequency ($f_{IF}$). In other words, it can be said that $f_{IF}$ is equal to $f_s/8$. For example, if the sampling rate of the signal from the SDM ADC 128a is $A \cdot f_{IF}$, then the decimator 208a could reduce the sampling frequency from $A \cdot f_{IF}$ to $B \cdot f_{IF}$, and the decimator 216a could reduce the sampling frequency from $B \cdot f_{IF}$ to $f_s = 8 \cdot f_{IF}$, where A>B>8. As just one specific example that is provided merely for explanatory purposes, the sampling rate of the signal from the SDM ADC 128a could be $96 \cdot f_{IF}$, the decimator 208a could reduce the sampling frequency to $16 \cdot f_{IF}$, and the decimator 216a could further reduce the sampling frequency to $8 \cdot f_{IF}$. One of ordinary skill in the art will recognize that the value A could be a variety of other integer values besides 96, and could also be a non-integer value (such as a number M/L where M and L are integers). Similarly, the value of B could be a variety of other integer or non-integer values besides the integer value 16. The multi-stage decimator 204b acts to convert the sampling rate of the signal from the SDM ADC 128b to $f_s$ which is equal to 8 times $f_{IF}$, in a manner similar to that of the multi-stage decimator 204a.

An output of the multi-stage decimator 204a may be coupled to an input of a filter 224a and the output of the multi-stage decimator 204b may be coupled to an input of a filter 224b. The filters 224a and 224b could be high pass filter, or any other suitable filter. Optionally, the filters 224a and 224b may be omitted.

A local oscillator (LO) generator 228 provides two reference signals to the complex IF mixer 200: $\cos(2 \cdot \pi \cdot f_{IF} t)$ and $\sin(2 \cdot \pi \cdot f_{IF} t)$. Because these references signals have a sampling rate of $8 \cdot f_{IF}$, they each can be represented by the sequence $[1, \sqrt{2}/2, 0, -\sqrt{2}/2, -1, -\sqrt{2}/2, 0, \sqrt{2}/2, 1, \sqrt{2}/2, 0, -\sqrt{2}/2, \ldots]$, with the sequence corresponding to $\sin(2 \cdot \pi \cdot f_{IF} t)$ being delayed by 2 samples with respect to the sequence corresponding to $\cos(2 \cdot \pi \cdot f_{IF} t)$. A quantized value of $\sqrt{2}/2$ in binary is 0.10110101. One of ordinary skill in the art will recognize that a multiplication operation involving the binary value 0.10110101 can be implemented by 4 addition operations. For example, a circuit having four adders could be utilized to perform the multiplication operation. As another example, a circuit having two adders could be time-multiplexed to perform the four addition operations. As yet another example, one adder could be time-multiplexed to perform the four addition operations. Thus, each of the multipliers 232, 234, 236, and 238 of the complex IF mixer 200 can be implemented as a circuit that selectively either passes a signal sample unchanged, inverts its sign, outputs a zero, multiplies the signal by 0.10110101 bin (using four or less adders, for example), or multiplies the signal by −0.10110101 (using the same four or less adders, for example). Such a circuit will require many less gates than a conventional multiplier. Of course, a multiplier such as a conventional multiplier could be used in some implementations.

Although one quantized value of $\sqrt{2}/2$ is mentioned above, the value $\sqrt{2}/2$ may be quantized to different numbers of bits as well. As just one additional example, a more accurate quantized value of $\sqrt{2}/2$ in binary having more bits is 0.1011010100000101. A multiplication operation involving this operation can be implemented by 6 addition operations. For example, a circuit having six adders could be utilized to perform the multiplication operation. As another example, a circuit having three adders could be time-multiplexed to perform the six addition operations. As yet another example, a circuit having two adders could be time-multiplexed to perform the six addition operations. As still another example, one adder could be time-multiplexed to perform the six addition operations.

An output of the filter 224a is coupled to a first input of the complex IF mixer 200, and an output of the filter 224b is coupled to a second input of the complex IF mixer 200. In particular, the output of the filter 224a is coupled to a first input of the multiplier 232 and is coupled to a first input of the multiplier 234. A second input of the multiplier 232 is coupled to a $\cos(2 \cdot \pi \cdot f_{IF} t)$ output of the local oscillator generator 228, and a second input of the multiplier 234 is coupled to a $\sin(2 \cdot \pi \cdot f_{IF} t)$ output of the local oscillator generator 228. Similarly, the output of the filter 224b is coupled to a first input of the multiplier 236 and is coupled to a first input of the multiplier 238. A second input of the multiplier 236 is coupled to the $\cos(2 \cdot \pi \cdot f_{IF} t)$ output of the local oscillator generator 228, and a second input of the multiplier 238 is coupled to the $\sin(2 \cdot \pi \cdot f_{IF} t)$ output of the local oscillator generator 228.

The multiplier 232 multiplies the output of the filter 224a with $\cos(2 \cdot \pi \cdot f_{IF} t)$, and the multiplier 234 multiplies the output of the filter 224a with $\sin(2\cdot\pi\cdot f_{IF} t)$. Similarly, the multiplier 236 multiplies the output of the filter 224b with $\cos(2\cdot\pi\cdot f_{IF} t)$, and the multiplier 238 multiplies the output of the filter 224b with $\sin(2\cdot\pi\cdot f_{IF} t)$. An output of the multiplier 232 and an output of the multiplier 238 are coupled to inputs of a summing device 244a. The summing device 244a subtracts the output of the multiplier 238 from the output of the multiplier 232. An output of the multiplier 234 and an output of the multiplier 236 are coupled to inputs of a summing device 244b. The summing device 244b adds the output of the multiplier 234 to the output of the multiplier 236.

The output of the summing device 244a may be coupled to an input of a filter 248a, and the output of the summing device 244b may be coupled to an input of a filter 248b. The filters 248a and 248b may be low pass filters that attenuate unwanted high frequency components such as high frequency components resulting from the mixing process implemented by the complex IF mixer 200. An output of the filter 248a may be coupled to an input of a multi-stage decimator 252a, and an output of the filter 248b may be coupled to an input of a multi-stage decimator 252b. The multi-stage decimator 252a may include a decimator 254a having a filter 256a. The filter 256a may act as a decimation filter. Similarly, the multi-stage decimator 252b may include a decimator 254b having a filter 256b that acts as a decimation filter. The multi-stage decimator 204a may also include a decimator 260a having a decimation filter 264a. An output of the decimator 254a may be coupled to an input of the decimator 264a. Similarly, the multi-stage decimator 252b may also include a decimator 260b having a decimation filter 264b. An output of the decimator 254b may be coupled to an input of the decimator 260b.

The multi-stage decimator 252a and the multi-stage decimator 252b act to convert the $8\cdot f_{IF}$ sampling rate to a lower sampling rate, and the outputs of the multi-stage decimator 252a and the multi-stage decimator 252b may be the I and Q signals. As just one specific example that is provided merely for explanatory purposes, the decimator 254a could reduce the sampling frequency from $8\cdot f_{IF}$ to $4\cdot f_{IF}$, and the decimator 260a could further reduce the sampling frequency to $2\cdot f_{IF}$. Similarly, the multi-stage decimator 252b acts to convert the $8\cdot f_{IF}$ sampling rate to a lower rate. One of ordinary skill in the art will recognize that the degree of decimation after the complex IF mixer 200 could be more or less than in this illustrative example. In fact, in some implementations, decimation may be omitted after the complex IF mixer 200.

It is to be understood that the system illustrated in FIG. 2 is just an example in which a mixer may operate on a digital signal with a corresponding sampling rate of $8\cdot f_{IF}$. For example, the multi-stage decimators of FIG. 2 could be implemented as single-stage decimators. As another example, interpolators could be included before the complex IF mixer 200 and/or after the complex IF mixer 200 to permit changing the sampling rate by some fraction L/M, where L and M are integers.

Figure 3:
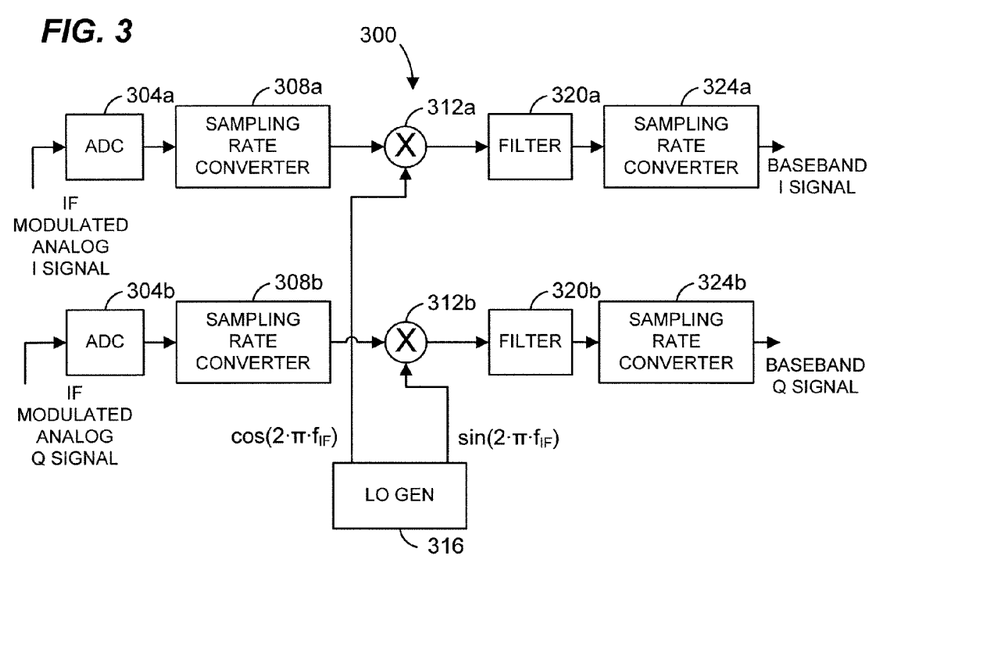
FIG. 3 is a block diagram of a portion of a receiver that utilizes another example IF mixer.

As yet another example, IF mixers other than the complex IF mixer 200 could be utilized. For instance, FIG. 3 is a block diagram of a system that utilizes an IF mixer 300. In the system of FIG. 3, analog IF modulated I and Q signals are converted to digital signals having a sampling frequency $f_s$ by ADCs 304a and 304b, respectively. The ADCs 304 and 304b may comprise SDM ADCs or any other suitable type of ADC. Outputs of the ADC's 304a and 304b are coupled to inputs of sample rate converters 308a and 308b, respectively. The sample rate converters 308a and 308b may be any type of suitable sample rate converter and may include a single-stage decimator, multi-stage decimators, an interpolator, a multi-stage interpolator, an L/M sampling rate converter where L and M are integers, etc. Outputs of the sample rate converters 308a and 308b are signals having a sampling rate of $8\cdot f_{IF}$. Optionally, the sample rate converters 308a and 308b may be omitted if the ADCs 304a and 304b are configured to generate signals having a sampling rate of $8\cdot f_{IF}$.

The IF mixer 300 may comprise a multiplier 312a and a multiplier 312b that receive sinusoidal signals from a LO generator 316. As with the LO generator 228 of FIG. 2, the LO generator 316 provides two reference signals to the complex IF mixer 300: $\cos(2\cdot\pi\cdot f_{IF} t)$ and $\sin(2\cdot\pi\cdot f_{IF} t)$ at a sampling rate of $8\cdot f_{IF}$. As described above, the signals $\cos(2\cdot\pi\cdot f_{IF} t)$ and $\sin(2\cdot\pi\cdot f_{IF} t)$ can be represented by the sequence [1, 0.10110101 (bin), 0, −0.10110101 (bin), −1, −0.10110101 (bin), 0, 0.10110101 (bin), 1, 0.10110101 (bin), 0, −0.10110101 (bin), ... ], with the sequence corresponding to $\sin(2\cdot\pi\cdot f_{IF} t)$ being delayed by 2 samples with respect to the sequence corresponding to $\cos(2\cdot\pi\cdot f_{IF} t)$. Thus, each of the multipliers 312a and 312b of the IF mixer 300 can be implemented as a circuit that selectively either passes a signal sample unchanged, inverts its sign, outputs a zero, multiplies the signal by 0.10110101 bin (using four addition operations, for example), or multiplies the signal by -0.10110101 (using four addition operations, for example). Of course, the value $\sqrt{2}/2$ may be quantized to a different number of bits.

An output of the multiplier 312a is coupled to an input of a filter 320a, and an output of the multiplier 312b is coupled to an input of a filter 320b. The filters 320a and 320b may be low pass filters that attenuate unwanted high frequency components such as high frequency components resulting from the mixing process implemented by the IF mixer 300.

Outputs of the filters 320a and 320b are coupled to inputs of sample rate converters 324a and 324b, respectively. The sample rate converters 324a and 324b may be any type of suitable sample rate converter and may include a single-stage decimator, multi-stage decimators, an interpolator, a multi-stage interpolator, an L/M sampling rate converter where L and M are integers, etc. The sample rate converters 324a and 324b may convert from a sampling rate of $8\cdot f_{IF}$ to any suitable sampling rate. Outputs of the sample rate converters 324a and 324b may be provided to an I/Q demodulator, for example. Optionally, the sample rate converters 324a and 324b may be omitted and outputs of the filters 320a and 320b, having the sampling rate of $8\cdot f_{IF}$, may be provided to the I/Q demodulator, for example.

Figure 4:
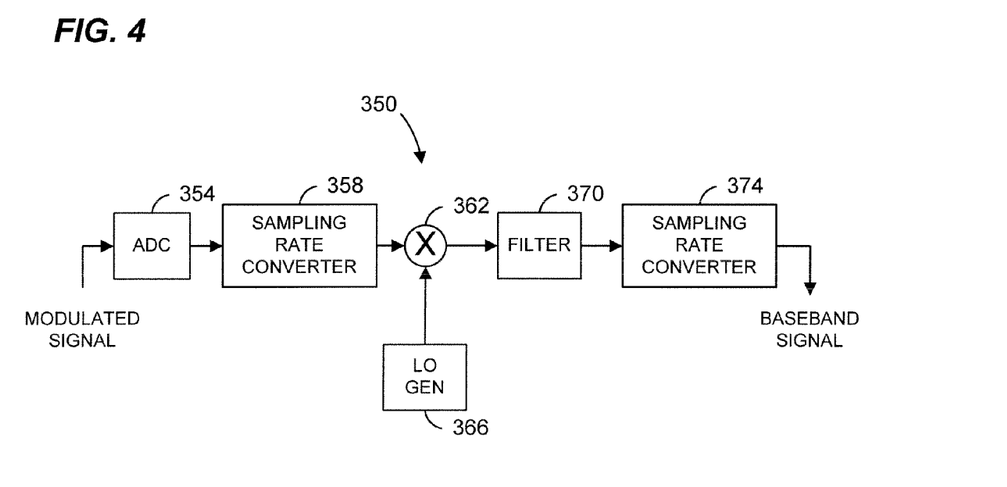
FIG. 4 is a block diagram of a portion of another receiver that utilizes yet another example mixer.

FIG. 4 is a block diagram of a system that utilizes an IF mixer 350. In the system of FIG. 4, analog IF signal is converted to a digital signal having a sampling frequency $f_s$ by an ADC 354. The ADC 354 may comprise a SDM ADC or any other suitable type of ADC. An output of the ADC 354 is coupled to an input of a sample rate converter 3358. The sample rate converter 358 may be any type of suitable sample rate converter and may include a single-stage decimator, multi-stage decimators, an interpolator, a multi-stage interpolator, an L/M sampling rate converter where L and M are integers, etc. An output of the sample rate converter 358 is a signal having a sampling rate of $8\cdot f_{IF}$. Optionally, the sample rate converter 358 may be omitted if the ADC 354 is configured to generate an output signal having a sampling rate of $8\cdot f_{IF}$.

The IF mixer 350 may comprise a multiplier 362 that receives sinusoidal signals from a LO generator 366. Similar to the LO generator 228 of FIG. 2, the LO generator 366 provides a sinusoidal reference signal to the complex IF mixer 350 at a sampling rate of $8\cdot f_{IF}$. As described above, a sinusoidal signal having a frequency of $f_{IF}$ and a sampling rate of $8\cdot f_{IF}$ can be represented by the sequence [1, 0.10110101 (bin), 0, −0.10110101 (bin), −1, −0.10110101 (bin), 0, 0.10110101 (bin), 1, 0.10110101 (bin), 0, −0.10110101 (bin), . . . ]. Thus, the multiplier 362 of the IF mixer 350 can be implemented as a circuit that selectively either passes a signal sample unchanged, inverts its sign, outputs a zero, multiplies the signal by 0.10110101 bin (using four addition operations, for example), or multiplies the signal by −0.10110101 (using four addition operations, for example). Of course, the value $\sqrt{2}/2$ may be quantized to a different number of bits.

An output of the multiplier 366 is coupled to an input of a filter 370, which may be low pass filter that attenuates unwanted high frequency components such as high frequency components resulting from the mixing process implemented by the IF mixer 350.

An output of the filter 370 may be coupled to an input of a sample rate converter 374. The sample rate converter 374 may be any type of suitable sample rate converter and may include a single-stage decimator, multi-stage decimators, an interpolator, a multi-stage interpolator, an L/M sampling rate converter where L and M are integers, etc. The sample rate converter 374 may convert from a sampling rate of $8 \cdot f_{IF}$ to any suitable sampling rate. An output of the sample rate converter 374 may be a baseband signal, for example. Optionally, the sample rate converter 374 may be omitted.

Figure 5:
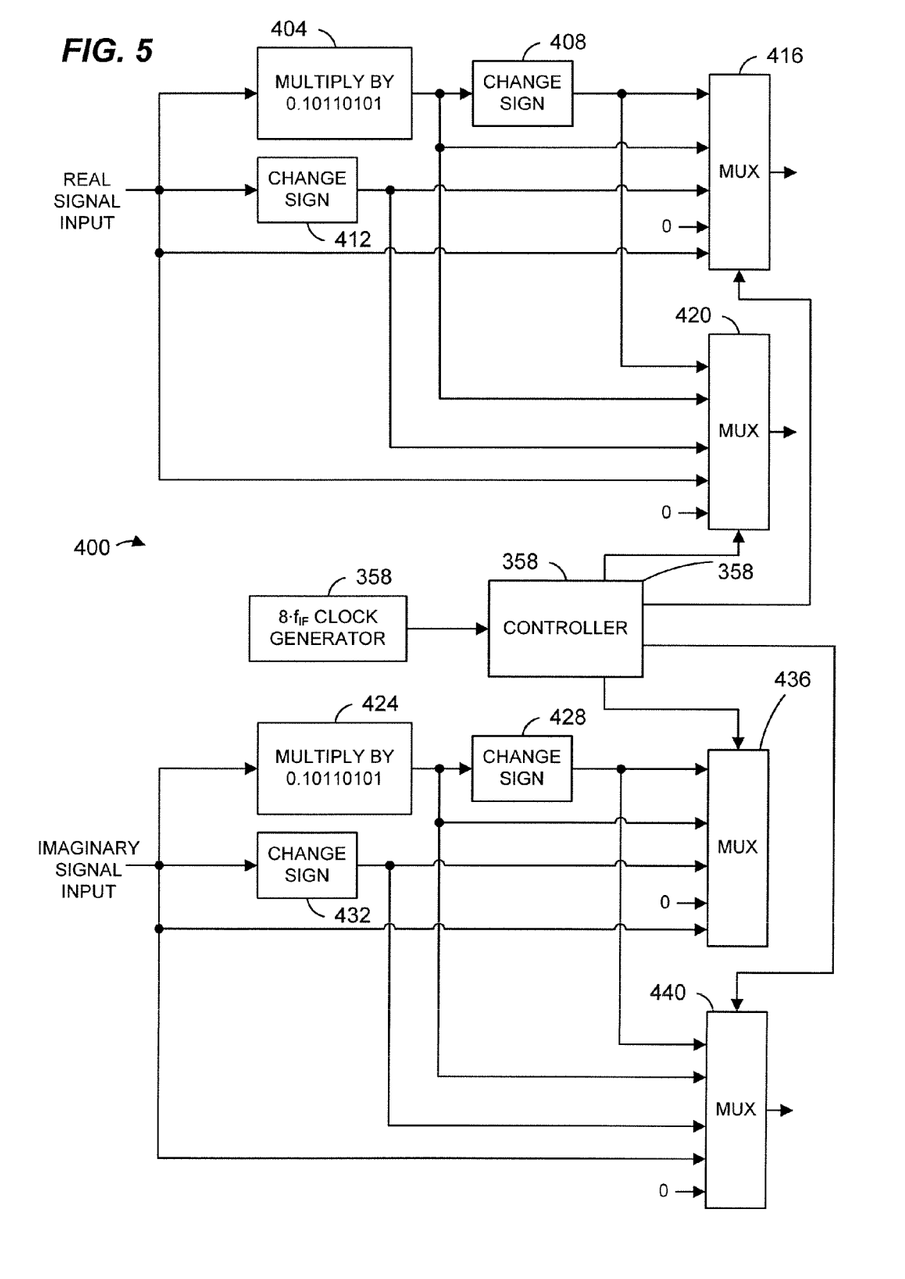
FIG. 5 is a block diagram of an example complex mixer that may be utilized with a receiver such as the receiver of FIG. 1.

In the above-described examples, a local oscillator that generates one or more sinusoidal signals having a frequency $8 \cdot f_{IF}$ is illustrated as being separate from one or more multipliers that multiply signals with the local oscillator output. It will be understood, however, that mixers need not be implemented in this way. For instance, FIG. 5 is block diagram of an example mixer 400 that may be utilized with a system such as the system of FIG. 2.

The mixer 400 receives a real signal input that may correspond to an output of the filter 224a of FIG. 2, for example. The mixer also receives an imaginary signal input that may correspond to an output of the filter 224b of FIG. 2, for example. With regard to the real signal input, it is coupled to a multiplier 404 that multiplies the real signal input by the value 0.10110101 (bin). As described above, such a multiplier may be implemented using four or less adders, for example. Of course, the value $\sqrt{2}/2$ may be quantized to a different number of bits. An output of the multiplier 404 is coupled to an input of a sign changing circuit 408, which changes the sign of the multiplier output. The real signal input is also coupled with a sign changing circuit 412, which changes the sign of the real signal input. Further, the real signal input is coupled to an input of a multiplexer 416. Other inputs of the multiplexer 416 are coupled to the output of the multiplier 404, an output of the sign changing circuit 408, an output of the sign changing circuit 412, and a constant 0. Thus, the multiplexer 416 may be controlled to generate at its output either the real signal unchanged, the real signal with its sign changed, the real signal multiplied by 0.10110101 bin, the real signal multiplied by −0.10110101, or the value 0. An output of the multiplexer 416 may correspond to the output of the multiplier 232 of FIG. 2, for example.

The mixer 400 also includes a multiplexer 420. Inputs of the multiplexer 420 are coupled to the real signal input, the output of the multiplier 404, an output of the sign changing circuit 408, an output of the sign changing circuit 412, and a constant 0. Thus, the multiplexer 420 may be controlled to generate at its output either the real signal unchanged, the real signal with its sign changed, the real signal multiplied by 0.10110101 bin, the real signal multiplied by −0.10110101, or the value 0. Of course, the value $\sqrt{2}/2$ may be quantized to a different number of bits. An output of the multiplexer 420 may correspond to the output of the multiplier 234 of FIG. 2, for example.

With regard to the imaginary signal input, it is coupled to a multiplier 424 that multiplies the imaginary signal input by the value 0.10110101 (bin). As described above, such a multiplier may be implemented using four or less adders, for example. Of course, the value $\sqrt{2}/2$ may be quantized to a different number of bits. An output of the multiplier 424 is coupled to an input of a sign changing circuit 428, which changes the sign of the multiplier output. The imaginary signal input is also coupled with a sign changing circuit 432, which changes the sign of the imaginary signal input. Further, the imaginary signal input is coupled to an input of a multiplexer 436. Other inputs of the multiplexer 436 are coupled to the output of the multiplier 424, an output of the sign changing circuit 428, an output of the sign changing circuit 432, and a constant 0. Thus, the multiplexer 436 may be controlled to generate at its output either the imaginary signal unchanged, the imaginary signal with its sign changed, the imaginary signal multiplied by 0.10110101 bin, the imaginary signal multiplied by −0.10110101, or the value 0. An output of the multiplexer 436 may correspond to the output of the multiplier 236 of FIG. 2, for example.

The mixer 400 also includes a multiplexer 440. Inputs of the multiplexer 440 are coupled to the imaginary signal input, the output of the multiplier 424, an output of the sign changing circuit 428, an output of the sign changing circuit 432, and a constant 0. Thus, the multiplexer 440 may be controlled to generate at its output either the imaginary signal unchanged, the imaginary signal with its sign changed, the imaginary signal multiplied by 0.10110101 bin, the imaginary signal multiplied by −0.10110101, or the value 0. Of course, the value $\sqrt{2}/2$ may be quantized to a different number of bits. An output of the multiplexer 440 may correspond to the output of the multiplier 238 of FIG. 2, for example.

The mixer 400 further includes a clock generator 444 that generates a clock signal at the frequency $8 \cdot f_{IF}$ and a controller 448 that receives the clock signal. The controller 448 generates multiplexer control signals that control the multiplexers 416, 420, 436, and 440. In particular, the multiplexers 416, 420, 436, and 440 are controlled to output the sequence of values indicated in Table 1.

TABLE 1

| Clock Period | Multiplexer 416 | Multiplexer 420 | Multiplexer 436 | Multiplexer 440 |
|---|---|---|---|---|
| 1 | Real Signal | 0 | Imag. Signal | 0 |
| 2 | Real Signal * 0.10110101 | Real Signal * 0.10110101 | Imag. Signal * 0.10110101 | Imag. Signal * 0.10110101 |
| 3 | 0 | Real Signal | 0 | Real Signal |
| 4 | Real Signal * −0.10110101 | Real Signal * 0.10110101 | Imag. Signal * −0.10110101 | Imag. Signal * 0.10110101 |
| 5 | −Real Signal | 0 | −Imag. Signal | 0 |
| 6 | Real Signal * −0.10110101 | Real Signal * −0.10110101 | Imag. Signal * −0.10110101 | Imag. Signal * −0.10110101 |
| 7 | 0 | −Real Signal | 0 | −Imag. Signal |
| 8 | Real Signal * 0.10110101 | Real Signal * −0.10110101 | Imag. Signal * 0.10110101 | Imag. Signal * −0.10110101 |
| 9 | Real Signal | 0 | Imag. Signal | 0 |
| 10 | Real Signal * 0.10110101 | Real Signal * 0.10110101 | Imag. Signal * 0.10110101 | Imag. Signal * 0.10110101 |
| 11 | 0 | Real Signal | 0 | Imag. Signal |
| 12 | Real Signal * −0.10110101 | Real Signal * 0.10110101 | Imag. Signal * −0.10110101 | Imag. Signal * 0.10110101 |
| 13 | −Real Signal | 0 | −Imag. Signal | 0 |
| . . . | . . . | . . . | . . . | . . . |

Of course, the mixer 400 of FIG. 5 is merely one example of a system to generate the sequence of values indicated in Table 1. One of ordinary skill in the art will recognize many other implementations that may be suitable. Further, one of ordinary skill in the art will recognize that mixers utilizing techniques similar to those illustrated by the mixer 400 may be used to implement the mixers of FIGS. 3 and 4. Still further, it is to be understood that the value $\sqrt{2}/2$ may be quantized to a different number of bits as compared to the binary number 0.10110101.

Although the examples above were described in the context of a superheterodyne receiver, the techniques can be utilized in other contexts as well. For example, a direct conversion receiver could utilize a mixer that generates a sinusoid at eight times the carrier frequency. Additionally, the techniques could be used in transmitters. For example, a transmitter could utilize a mixer that generates a sinusoid having a sampling frequency equal to eight times the IF or eight times the carrier frequency. In other words, the frequency of the mixing signal is equal to one eighth of the sampling frequency.

Additionally, the same techniques may be used when the difference between the sampling frequency ($f_s$) and the frequency of the mixing signal ($f_m$) is one eighth of $f_s$ (i.e., $f_m=7 \cdot f_s/8$). Due to aliasing, a sinusoidal mixing signal having a frequency $f_{mix}=7 \cdot f_s/8$, and being sampled at $f_s$ will comprise the sequence [1, $\sqrt{2}/2$, 0, $-\sqrt{2}/2$, $-1$, $-\sqrt{2}/2$, 0, $\sqrt{2}/2$, 1, $\sqrt{2}/2$, 0, $-\sqrt{2}/2$, . . . ], which is the same as a sinusoidal mixing signal having a frequency $f_{mix}=f_s/8$ and being sampled at $f_s$. In other words, a sinusoidal mixing signal having a frequency $f_{mix}=7 \cdot f_s/8$, and being sampled at $f_s$ corresponds to a sinusoid having a frequency $f_{mix}=f_s/8$ and being sampled at $f_s$.

Figure 6A:
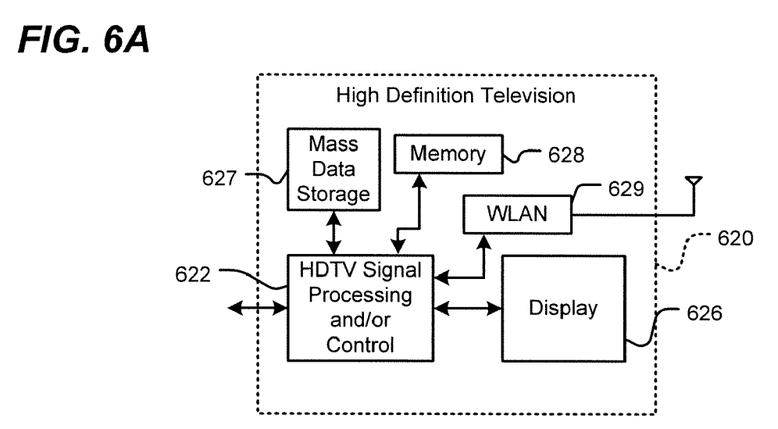
FIG. 6A is a block diagram of a high definition television that may utilize a receiver such as the receiver of FIG. 1, and that may utilize a mixer such as the mixers of FIGS. 2-5.

The methods, systems, techniques, etc., described above may be utilized in a variety of devices that employ wired or wireless communications. Referring now to FIGS. 6A-6E, various example devices that may utilize the techniques described above will be described. Referring to FIG. 6A, the techniques may be utilized in a high definition television (HDTV) 620. The HDTV 620 includes signal processing and/or control circuits, which are generally identified in FIG. 6A at 622, a WLAN interface 629, and a mass data storage 627. The techniques may be utilized in the WLAN interface 629 or the signal processing circuit and/or control circuit 622, for example. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. The mass data storage 627 may include one or more hard disk drives (HDDs) and/or one or more digital versatile disks (DVDs). One or more of the HDDs may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 6B:
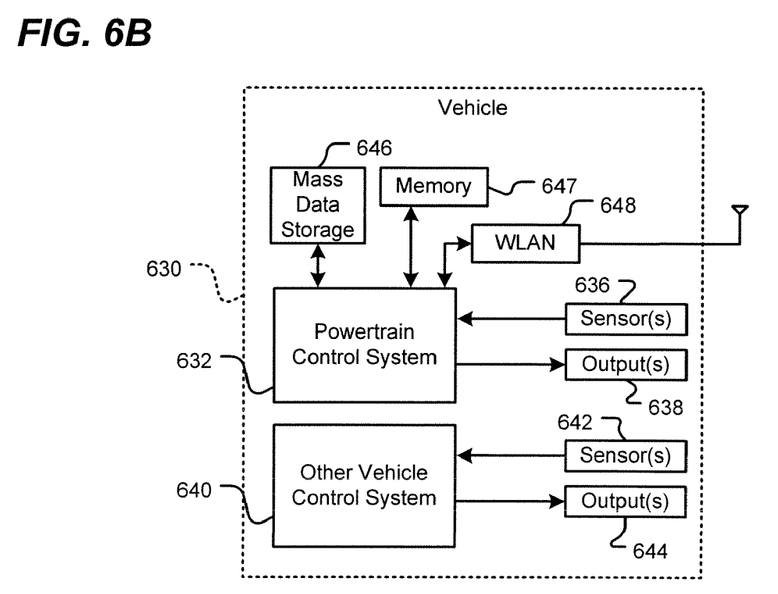
FIG. 6B is a block diagram of a vehicle that may utilize a receiver such as the receiver of FIG. 1, and that may utilize a mixer such as the mixers of FIGS. 2-5.

Referring now to FIG. 6B, the methods, systems, techniques, etc., described above may be utilized in a control system of a vehicle 630. In some implementations, they may be implemented by a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The methods, systems, techniques, etc., described above may also be implemented in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. One or more of the HDDs may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The methods, systems, techniques, etc., described above may also be implemented in the WLAN interface 648. The control system 640 may also include mass data storage, memory and/or a WLAN interface (all not shown).

Figure 6C:
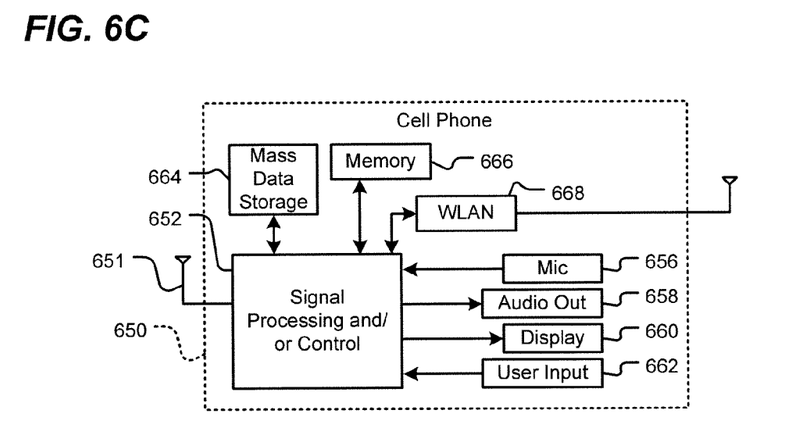
FIG. 6C is a block diagram of a cellular phone that may utilize the a receiver such as the receiver of FIG. 1, and that may utilize a mixer such as the mixers of FIGS. 2-5.

Referring now to FIG. 6C, the methods, systems, techniques, etc., described above may also be utilized in a cellular phone 650 that may include a cellular antenna 651. The cellular phone 650 includes signal processing and/or control circuits, which are generally identified in FIG. 6C at 652, a WLAN interface 668, and a mass data storage 664. The methods, systems, techniques, etc., may be implemented in the signal processing and/or control circuits 652 and/or the WLAN interface 668, for example. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices for example hard disk drives HDD and/or DVDs. At least one HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668.

Figure 6D:
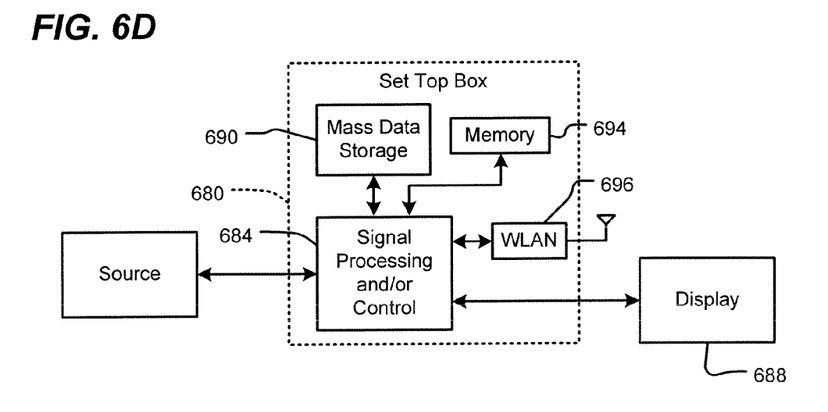
FIG. 6D is a block diagram of a set top box that may utilize the a receiver such as the receiver of FIG. 1, and that may utilize a mixer such as the mixers of FIGS. 2-5.

Referring now to FIG. 6D, the methods, systems, techniques, etc., described above may be utilized in a set top box 680. The set top box 680 includes signal processing and/or control circuits, which are generally identified in FIG. 6D at 684, a WLAN interface 696, and a mass data storage device 690. The methods, systems, techniques, etc., may be implemented in the signal processing and/or control circuits 684 and/or the WLAN interface 696, for example. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696.

Figure 6E:
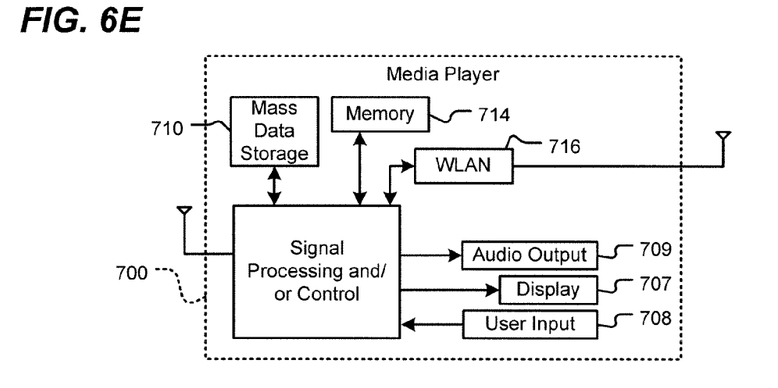
FIG. 6E is a block diagram of a media player that may utilize the a receiver such as the receiver of FIG. 1, and that may utilize a mixer such as the mixers of FIGS. 2-5.

Referring now to FIG. 6E, the methods, systems, techniques, etc., described above may be utilized in a media player 700. The media player 700 may include signal processing and/or control circuits, which are generally identified in FIG. 6E at 704, a WLAN interface 716, and a mass data storage device 710. The methods, systems, techniques, etc., may be implemented in the signal processing and/or control circuits 704 and/or the WLAN interface 716, for example. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may be a mini HDD that includes one or more platters having a diameter that is smaller than approximately 1.8". Media player 700 may be connected to memory 714 such as RAM, ROM, low latency nonvolatile memory such as flash memory and/or other suitable electronic data storage. Media player 700 also may support connections with a WLAN via a WLAN network interface 716. Still other implementations in addition to those described above are contemplated.

Figure 6F:
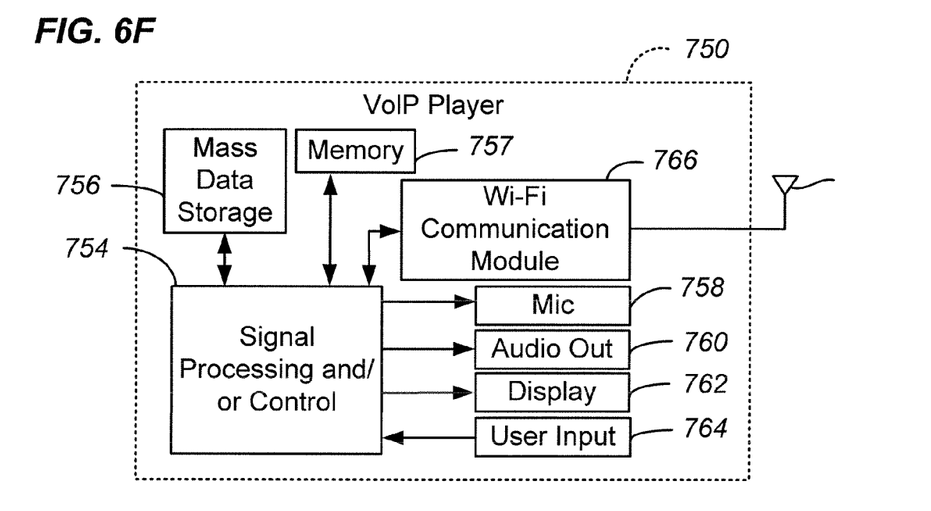
FIG. 6F is a block diagram of a voice over IP device that may utilize the a receiver such as the receiver of FIG. 1, and that may utilize a mixer such as the mixers of FIGS. 2-5.

Referring to FIG. 6F, the methods, systems, techniques, etc., described above may be utilized in a Voice over Internet Protocol (VoIP) phone 750 that may include an antenna 754, signal processing and/or control circuits 758, a wireless interface 762, and a mass data storage 766. The methods, systems, techniques, etc., may be implemented in the signal processing and/or control circuits 758 and/or the wireless interface 762, for example. In some implementations, VoIP phone 750 includes, in part, a microphone 770, an audio output 774 such as a speaker and/or audio output jack, a display monitor 778, an input device 782 such as a keypad, pointing device, voice actuation and/or other input devices, and a Wireless Fidelity (Wi-Fi) communication module 762. Signal processing and/or control circuits 758 and/or other circuits (not shown) in VoIP phone 750 may process data, perform coding and/or encryption, perform calculations, format data and/or perform other VoIP phone functions.

VoIP phone 750 may communicate with mass data storage 766 that stores data in a nonvolatile manner such as optical and/or magnetic storage devices, for example hard disk drives HDD and/or DVDs. At least one HDD may have the configuration shown in FIG. 12A and/or at least one DVD may have the configuration shown in FIG. 12B. The HDD may be a mini HDD that includes one or more platters having a diameter that is smaller than approximately 1.8". VoIP phone 750 may be connected to memory 786, which may be a RAM, ROM, low latency nonvolatile memory such as flash memory and/or other suitable electronic data storage. VoIP phone 750 is configured to establish communications link with a VoIP network (not shown) via Wi-Fi communication module 762.

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method of mixing an information signal, comprising:
   generating a digital information signal at a sampling frequency $f_s$; and
   generating a mixed signal as a multiplication of the digital information signal with a mixing signal at the sampling frequency $f_s$, wherein the mixing signal corresponds to a sinusoid having a frequency $f_m$ equal to $f_s/8$, and wherein generating the mixed signal comprises repeatedly generating the following sequence: the digital information signal, the digital information signal multiplied by a quantized representation of $\sqrt{2}/2$, the value 0, the digital information signal multiplied by a quantized representation of $-\sqrt{2}/2$, the digital information signal with its sign changed, the digital information signal multiplied by the quantized representation of $-\sqrt{2}/2$, the value 0, and the digital information signal multiplied by quantized representation of $\sqrt{2}/2$.

2. A method according to claim 1, wherein generating the mixed signal comprises:
generating the mixing signal as a sinusoidal signal;
providing the sinusoidal signal to a first input of a multiplier; and
providing the digital information signal to a second input of the multiplier.

3. A method according to claim 2, wherein the sinusoidal signal comprises the sequence: the value 1, the quantized representation of $\sqrt{2}/2$, the value 0, the quantized representation of $-\sqrt{2}/2$, the value $-1$, the quantized representation of $-\sqrt{2}/2$, the value 0, and the quantized representation of $\sqrt{2}/2$.

4. A method according to claim 3, wherein the sinusoidal signal comprises the sequence: the value 1, the binary value 0.10110101, the value 0, the binary value $-0.10110101$, the value $-1$, the binary value $-0.10110101$, the value 0, and the binary value 0.10110101.

5. A method according to claim 3, wherein the sinusoidal signal comprises the sequence: the value 1, the binary value 0.1011010100000101, the value 0, the binary value $-0.1011010100000101$, the value $-1$, the binary value $-0.1011010100000101$, the value 0, and the binary value 0.1011010100000101.

6. A method according to claim 1, wherein generating the mixed signal comprises repeatedly generating the following sequence: the digital information signal, the digital information signal multiplied by the binary value 0.10110101, the value 0, the digital information signal multiplied by the binary value $-0.10110101$, the digital information signal with its sign changed, the digital information signal multiplied by the binary value $-0.10110101$, the value 0, and the digital information signal multiplied by the binary value 0.10110101.

7. A method according to claim 1, wherein generating the mixed signal comprises repeatedly generating the following sequence: the digital information signal, the digital information signal multiplied by the binary value 0.1011010100000101, the value 0, the digital information signal multiplied by the binary value $-0.1011010100000101$, the digital information signal with its sign changed, the digital information signal multiplied by the binary value $-0.1011010100000101$, the value 0, and the digital information signal multiplied by the binary value 0.1011010100000101.

8. A method according to claim 1, wherein generating the digital information signal comprises sampling an analog information signal at the sampling frequency $f_s$ to generate a sampled signal; and
quantizing the sampled signal.

9. A method according to claim 1, wherein generating the digital information signal comprises:
generating a sampled intermediate frequency (IF) signal by sampling an analog IF signal at a frequency higher than $f_s$;
quantizing the sampled IF signal; and
converting the sampling frequency of the sampled IF signal to $f_s$.

10. A method according to claim 9, further comprising filtering with a high pass filter the sampled IF signal at the sampling frequency $f_s$.

11. A method according to claim 9, further comprising filtering the mixed signal with a low pass filter.

12. A method according to claim 1, further comprising generating a transmission signal based on the mixed signal.

13. A method according to claim 1, further comprising generating a baseband signal based on the mixed signal.

14. A method according to claim 1, wherein a frequency of the mixing signal is equal to $f_s/8$.

15. A method according to claim 1, wherein a frequency of the mixing signal is equal to $7 \cdot f_s/8$.

16. A mixer for a communication device, the mixer comprising:
an input to receive a digital information signal at a sampling frequency $f_s$; and
a multiplication circuit to generate a multiplication of the digital information signal by a mixing signal at the sampling frequency $f_s$, wherein the mixing signal corresponds to a sinusoid having a frequency $f_m$ equal to $f_s/8$, and wherein the multiplication circuit is configured to repeatedly generate the following sequence: the digital information signal, the digital information signal multiplied by a quantized representation of $\sqrt{2}/2$, the value 0, the digital information signal multiplied by a quantized representation of the digital information signal with its sign changed, the digital information signal multiplied by the quantized representation of $-\sqrt{2}/2$ the value 0, and the digital information signal multiplied by the quantized representation of $\sqrt{2}/2$.

17. A mixer according to claim 16, wherein the multiplication circuit is configured to repeatedly generate the following sequence: the digital information signal, the digital information signal multiplied by the binary value 0.10110101, the value 0, the digital information signal multiplied by the binary value $-0.10110101$, the digital information signal with its sign changed, the digital information signal multiplied by the binary value $-0.10110101$, the value 0, and the digital information signal multiplied by the binary value 0.10110101.

18. A mixer according to claim 17, wherein the multiplication circuit comprises a circuit portion having four or less adders to multiply the digital information signal by the binary value 0.10110101.

19. A mixer according to claim 18, wherein the multiplication circuit further comprises a multiplexer to select as an output of the multiplication circuit one of the digital information signal, the digital information signal with its sign changed, the digital information signal multiplied by the binary value 0.10110101, the digital information signal multiplied by the binary value $-0.10110101$, or the value 0.

20. A mixer according to claim 16, wherein the multiplication circuit is configured to repeatedly generate the following sequence: the digital information signal, the digital information signal multiplied by the binary value 0.1011010100000101, the value 0, the digital information signal multiplied by the binary value $-0.1011010100000101$, the digital information signal with its sign changed, the digital information signal multiplied by the binary value $-0.1011010100000101$, the value 0, and the digital information signal multiplied by the binary value 0.1011010100000101.

21. A mixer according to claim 20, wherein the multiplication circuit comprises a circuit portion having six or less adders to multiply the digital information signal by the binary value 0.1011010100000101.

22. A mixer according to claim 16, further comprising a local oscillator coupled to the multiplication circuit to generate the mixing signal.

23. A method according to claim 22, wherein the local oscillator is configured to repeatedly generate the digital sequence: the value 1, the quantized representation of $\sqrt{2}/2$, the value 0, the quantized representation of $-\sqrt{2}/2$, the value $-1$, the quantized representation of $-\sqrt{2}/2$, the value 0, and the quantized representation of $\sqrt{2}/2$.

24. A mixer according to claim 23, wherein the local oscillator is configured to repeatedly generate the digital sequence: the value 1, the binary value 0.10110101, the value 0, the binary value $-0.10110101$, the value $-1$, the binary value $-0.10110101$, the value 0, and the binary value 0.10110101.

25. A mixer according to claim 23, wherein the local oscillator is configured to repeatedly generate the digital sequence: the value 1, the binary value 0.1011010100000101, the value 0, the binary value $-0.1011010100000101$, the value $-1$, the binary value $-0.1011010100000101$, the value 0, and the binary value 0.1011010100000101.

26. A method of down-converting a received signal, comprising:
  converting a first analog modulated information signal to a first digital information signal at a sampling frequency $f_s$;
  filtering the first digital information signal with a first high-pass filter;
  generating a first mixed signal based on a multiplication of the first digital information signal with a first mixing signal at the sampling frequency $f_s$, wherein the first mixing signal corresponds to a sinusoid having a frequency $f_m$ equal to $f_s/8$, and wherein generating the first mixed signal comprises repeatedly generating the following sequence: the first digital information signal, the first digital information signal multiplied by a quantized representation of $\sqrt{2}/2$, the value 0, the first digital information signal multiplied by a quantized representation of $-\sqrt{2}/2$, the first digital information signal with its sign changed, the first digital information signal multiplied by the quantized representation of $-\sqrt{2}/2$, the value 0, and the first digital information signal multiplied by the quantized representation of $\sqrt{2}/2$; and
  filtering the first mixed signal with a first low-pass filter.

27. A method according to claim 26, wherein generating the first mixed signal comprises:
  generating the first mixing signal as a first sinusoidal signal;
  providing the first sinusoidal signal to a first input of a first multiplier; and
  providing the first digital information signal to a second input of the first multiplier.

28. A method according to claim 27, wherein the first sinusoidal signal comprises the sequence: the value 1, the quantized representation of $\sqrt{2}/2$, the value 0, the quantized representation of $-\sqrt{2}/2$, the value $-1$, the quantized representation of $-\sqrt{2}/2$, the value 0, and the quantized representation of $\sqrt{2}/2$.

29. A method according to claim 28, wherein the first sinusoidal signal comprises the sequence: the value 1, the binary value 0.10110101, the value 0, the binary value $-0.10110101$, the value $-1$, the binary value $-0.10110101$, the value 0, and the binary value 0.10110101.

30. A method according to claim 28, wherein the first sinusoidal signal comprises the sequence: the value 1, the binary value 0.1011010100000101, the value 0, the binary value $-0.1011010100000101$, the value $-1$, the binary value $-0.1011010100000101$, the value 0, and the binary value 0.1011010100000101.

31. A method according to claim 26, wherein generating the first mixed signal comprises repeatedly generating the following sequence: the first digital information signal, the first digital information signal multiplied by the binary value 0.10110101, the value 0, the first digital information signal multiplied by the binary value $-0.10110101$, the first digital information signal with its sign changed, the first digital information signal multiplied by the binary value $-0.10110101$, the value 0, and the first digital information signal multiplied by the binary value 0.10110101.

32. A method according to claim 26, wherein generating the first mixed signal comprises repeatedly generating the following sequence: the first digital information signal, the first digital information signal multiplied by the binary value 0.1011010100000101, the value 0, the first digital information signal multiplied by the binary value $-0.1011010100000101$, the first digital information signal with its sign changed, the first digital information signal multiplied by the binary value $-0.1011010100000101$, the value 0, and the first digital information signal multiplied by the binary value 0.1011010100000101.

33. A method according to claim 26, wherein generating the first digital information signal comprises sampling the first analog information signal at the sampling frequency $f_s$.

34. A method according to claim 26, wherein generating the first digital information signal comprises:
  generating an oversampled signal by sampling the first analog information signal at a frequency higher than $f_s$; and
  converting the sampling frequency of the oversampled signal to $f_s$.

35. A method according to claim 26, further comprising converting the sampling frequency of the first mixed signal to a frequency less than $f_s$.

36. A method according to claim 26, comprising:
  generating the first analog modulated information signal from the received signal;
  generating a second analog modulated information signal from the received signal;
  converting the second analog modulated information signal to a second digital information signal at the sampling frequency $f_s$;
  filtering the second digital signal with a second high-pass filter;
  generating a second mixed signal based on a multiplication of the second digital information signal with a second mixing signal at the sampling frequency $f_s$, wherein the second mixing signal corresponds to a sinusoid having a frequency $f_m$ equal to $f_s/8$; and
  filtering the second mixed signal with a second low-pass filter.

37. A method according to claim 36, wherein generating the first mixed signal comprises:
  generating a first multiplication signal as a multiplication of the first digital information signal with the first mixing signal;
  generating a second multiplication signal as a multiplication of the first digital information signal with the second mixing signal;
  generating the first mixed signal as a subtraction of the second multiplication signal from the first multiplication signal;
  wherein generating the second mixed signal comprises:

generating a third multiplication signal as a multiplication of the second digital information signal with the first mixing signal;
generating a fourth multiplication signal as a multiplication of the second digital information signal with the second mixing signal;
generating the second mixed signal as an addition of the third multiplication signal with the fourth multiplication signal;
wherein the first mixing signal corresponds to a first sinusoidal signal having a first phase and the second mixing signal corresponds to a second sinusoidal signal having a second phase 90° different than the first phase.

38. A down-converter for a communication device, the down-converter comprising:
a first analog-to-digital converter (ADC);
a first high-pass filter coupled to an output of the first ADC, wherein an output of the first high-pass filter is at a sampling frequency $f_s$;
a mixer having a first input coupled to the output of the first high-pass filter, the mixer configured to generate a first output based on a multiplication of a signal received via the first input with a first mixing signal at the sampling frequency $f_s$, wherein the first mixing signal corresponds to a sinusoid having a frequency $f_m$ equal to $f_s/8$, and wherein the mixer is configured to repeatedly generate the following sequence: the signal received via the first input, the signal received via the first input multiplied by a quantized representation of $\sqrt{2}/2$, the value 0, the signal received via the first input multiplied by a quantized representation of $\sqrt{2}/2$, the signal received via the first input with its sign changed, the signal received via the first input multiplied by the quantized representation of $-\sqrt{2}/2$, the value 0, and the signal received via the first input multiplied by the quantized representation of $\sqrt{2}/2$; and
a first low-pass filter having an input coupled to the first output of the mixer.

39. A down-converter according to claim 38, wherein the mixer is configured to repeatedly generate the following sequence: the signal received via the first input, the signal received via the first input multiplied by the binary value 0.10110101, the value 0, the signal received via the first input multiplied by the binary value −0.10110101, the signal received via the first input with its sign changed, the signal received via the first input multiplied by the binary value −0.10110101, the value 0, and the signal received via the first input multiplied by the binary value 0.10110101.

40. A down-converter according to claim 39, wherein the mixer comprises a multiplication circuit having four or less adders to multiply the signal received via the first input by the binary value 0.10110101.

41. A down-converter according to claim 40, wherein the multiplication circuit further comprises a multiplexer to select as an output of the multiplication circuit one of the signal received via the first input, the signal received via the first input with its sign changed, the signal received via the first input multiplied by the binary value 0.10110101, the signal received via the first input multiplied by the binary value −0.10110101, or the value 0.

42. A down-converter according to claim 38, wherein the mixer is configured to repeatedly generate the following sequence: the signal received via the first input, the signal received via the first input multiplied by the binary value 0.1011010100000101, the value 0, the signal received via the first input multiplied by the binary value −0.1011010100000101, the signal received via the first input with its sign changed, the signal received via the first input multiplied by the binary value −0.1011010100000101, the value 0, and the signal received via the first input multiplied by the binary value 0.1011010100000101.

43. A down-converter according to claim 42, wherein the mixer comprises a multiplication circuit having six or less adders to multiply the signal received via the first input by the binary value 0.1011010100000101.

44. A down-converter according to claim 38, further comprising a local oscillator coupled to the mixer to generate the first mixing signal.

45. A down-converter according to claim 38, wherein the first ADC is configured to sample at the sampling frequency $f_s$.

46. A down-converter according to claim 38, wherein the first ADC is configured to sample at a sampling frequency higher than $f_s$;
wherein the down-converter further comprises a sampling rate converter coupled in series with the first ADC and the first high-pass filter, wherein the sampling rate converter is configured to convert from a sampling frequency of the ADC to the sampling frequency $f_s$.

47. A down-converter according to claim 38, further comprising a sampling rate converter coupled to an output of the first low-pass filter, wherein the sampling rate converter is configured to convert from the sampling frequency $f_s$ to a lower sampling frequency.

48. A down-converter according to claim 38, further comprising:
a second ADC;
a second high-pass filter coupled to an output of the second ADC, wherein an output of the second high-pass filter has the sampling frequency $f_s$;
wherein the mixer has a second input coupled to an output of the second high-pass filter, the mixer configured to generate a second output based on a multiplication of a signal received via the second input with a second mixing signal at the sampling frequency $f_s$, wherein the second mixing signal corresponds to a sinusoid having a frequency $f_m$ equal to $f_s/8$; and
a second low-pass filter having an input coupled to the second output of the mixer.

49. A down-converter according to claim 48, wherein the mixer comprises:
a first multiplication circuit to generate a first multiplication signal as a multiplication of the signal received via the first input with the first mixing signal;
a second multiplication circuit to generate a second multiplication signal as a multiplication of the signal received via the first input with the second mixing signal;
a first summation circuit to generate a subtraction of the second multiplication signal from the first multiplication signal;
a third multiplication circuit to generate a third multiplication signal as a multiplication of the signal received via the second input with the first mixing signal;
a fourth multiplication circuit to generate a fourth multiplication signal as a multiplication of the signal received via the second input with the second mixing signal;
a second summation circuit to generate an addition of the third multiplication signal with the fourth multiplication signal;
wherein the first mixing signal is a first sinusoidal signal having a first phase and the second mixing signal is a second sinusoidal signal having a second phase 90° different than the first phase.

50. A method according to claim 38, wherein the local oscillator is configured to repeatedly generate the digital sequence: the value 1, the quantized representation of $\sqrt{2}/2$, the value 0, the quantized representation of $-\sqrt{2}/2$, the value $-1$, the quantized representation of $-\sqrt{2}/2$, the value 0, and the quantized representation of $\sqrt{2}/2$.

51. A down-converter according to claim 50, wherein the local oscillator is configured to repeatedly generate the digital sequence: the value 1, the binary value 0.10110101, the value 0, the binary value −0.10110101, the value −1, the binary value −0.10110101, the value 0, and the binary value 0.10110101.

52. A down-converter according to claim 50, wherein the local oscillator is configured to repeatedly generate the digital sequence: the value 1, the binary value 0.1011010100000101, the value 0, the binary value −0.1011010100000101, the value −1, the binary value −0.1011010100000101, the value 0, and the binary value 0.1011010100000101.

* * * * *